(12) United States Patent
Zvokelj

(10) Patent No.: US 10,840,124 B2
(45) Date of Patent: Nov. 17, 2020

(54) VACUUM ADJUSTMENT DEVICE HAVING A COLLET COUPLING

(71) Applicant: VAT HOLDING AG, Haag (CH)

(72) Inventor: Peter Zvokelj, Hochst (AT)

(73) Assignee: VAT HOLDING AG, Haag (CH)

( * ) Notice: Subject to any disclaimer, the term of this patent is extended or adjusted under 35 U.S.C. 154(b) by 0 days.

(21) Appl. No.: 16/118,154

(22) Filed: Aug. 30, 2018

(65) Prior Publication Data
US 2019/0067076 A1 Feb. 28, 2019

(30) Foreign Application Priority Data
Aug. 31, 2017 (EP) ..................... 17188778

(51) Int. Cl.
*H01L 21/687* (2006.01)
*H01L 21/67* (2006.01)
(Continued)

(52) U.S. Cl.
CPC .......... *H01L 21/68742* (2013.01); *F16K 3/02* (2013.01); *F16K 31/22* (2013.01);
(Continued)

(58) Field of Classification Search
CPC ......... H01L 21/68742; H01L 21/68785; H01L 21/68707; H01L 21/68714; F16B 21/20;
(Continued)

(56) References Cited

U.S. PATENT DOCUMENTS 633,852 A * 9/1899 Kendrick ............... B23B 31/201
279/50
935,977 A * 10/1909 Haskell ................. B23B 31/201
279/50
(Continued)

FOREIGN PATENT DOCUMENTS

DE 1 264 191 B1 3/1968
DE 77 31 993 U 1/1978
(Continued)

OTHER PUBLICATIONS

EP 17 18 8778 European Search Report, Feb. 7, 2018, pp. 1-8.

*Primary Examiner* — David Colon-Morales
(74) *Attorney, Agent, or Firm* — Muncy, Geissler, Olds & Lowe, P.C.

(57) ABSTRACT

A vacuum adjustment device having a coupling for coupling an active element and a drive unit is disclosed. The drive unit adjusts the coupling from a normal position into an active position, in which the active element provides its intended effect. A separating device separates the process atmosphere region (P) from an outer atmosphere region (A), wherein the drive unit is at least partially associated with the outer atmosphere region (A). The coupling has a locking element cooperating with a collet which are arranged for a relative position variation axially along or parallel to a receiving axis that the locking element is adjustable relative to the collet into an open position and into a closed position. The coupling provides an open changing state in the open
(Continued)

Figure 2C:
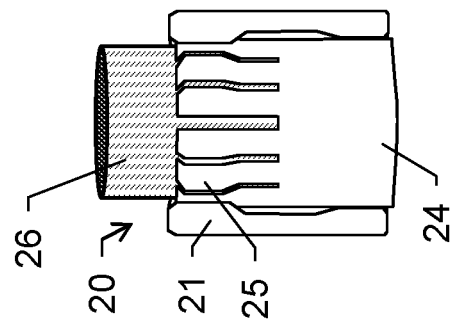

position by the interaction of the collet with the locking element and a closed working state in the closed position.

14 Claims, 3 Drawing Sheets

(51) Int. Cl.
*F16K 51/02* (2006.01)
*F16K 31/22* (2006.01)
*F16K 3/02* (2006.01)
*F16B 21/20* (2006.01)

(52) U.S. Cl.
CPC ........ *F16K 51/02* (2013.01); *H01L 21/67017* (2013.01); *H01L 21/68707* (2013.01); *H01L 21/68785* (2013.01); *F16B 21/20* (2013.01); *Y10T 279/17256* (2015.01)

(58) Field of Classification Search
CPC ................. B23B 31/201; B23B 31/202; Y10T 279/17256; Y10T 279/17239; Y10T 279/17307; Y10T 279/17521; Y10T 279/17529; F16K 3/02; F16K 3/0272; F16K 3/0281; F16K 3/314; F16K 31/22; F16K 51/02; F16K 35/06
See application file for complete search history.

(56) References Cited

U.S. PATENT DOCUMENTS

| | | | | |
|---|---|---|---|---|
| 1,013,438 A * | 1/1912 | Post | ...................... | B23B 31/201 279/50 |
| 1,208,846 A * | 12/1916 | Sheldon | .................. | E21B 31/18 294/86.28 |
| 1,667,485 A * | 4/1928 | MacDonald | ....... | H01R 13/6277 439/836 |
| 1,849,101 A * | 3/1932 | Livergood | .............. | F04B 53/16 403/365 |
| 2,179,930 A | 11/1939 | Harrington | | |
| 2,252,767 A * | 8/1941 | Hudson | .................. | E21B 31/18 294/86.21 |
| 2,670,963 A * | 3/1954 | Osborn | ................. | B23B 31/202 279/53 |
| 2,784,987 A * | 3/1957 | Corcoran | .............. | F16B 7/0413 285/82 |
| 3,145,969 A | 8/1964 | Von Zweck Tiemo | | |
| 3,171,664 A * | 3/1965 | Benjamin | .............. | A61C 1/144 279/50 |
| 3,172,676 A * | 3/1965 | Kern, Jr. | ................. | B23B 31/20 279/51 |
| 3,240,520 A * | 3/1966 | Dailey | ..................... | B64D 1/02 403/325 |
| 3,790,182 A * | 2/1974 | Schuman | .............. | B23B 31/028 279/43 |
| 3,967,847 A * | 7/1976 | Ellis | ........................ | B08B 9/426 294/116 |
| 4,059,883 A * | 11/1977 | Osborne | .............. | B25B 27/023 29/259 |
| 4,656,727 A * | 4/1987 | Itoh | ....................... | B23B 31/103 279/37 |
| 4,850,734 A * | 7/1989 | Naumec | ................ | B23B 31/261 403/322.1 |
| 4,867,463 A * | 9/1989 | Hopf | ..................... | B23B 31/202 279/46.7 |
| 5,207,130 A * | 5/1993 | Payne | ..................... | B25B 13/44 279/50 |
| 5,215,538 A | 6/1993 | Larkin | | |
| 5,489,225 A * | 2/1996 | Julian | .................. | A61N 1/3752 279/51 |
| 5,577,707 A | 11/1996 | Brida | | |
| 5,740,704 A * | 4/1998 | Payne | ..................... | B25B 13/44 279/50 |
| 5,879,128 A * | 3/1999 | Tietz | ................. | H01L 21/68742 414/757 |
| 6,056,266 A | 5/2000 | Blecha | | |
| 6,056,472 A * | 5/2000 | Latulippe | ............ | B29C 45/1775 403/299 |
| 6,089,537 A | 7/2000 | Olmsted | | |
| 6,213,478 B1 * | 4/2001 | Nishikawa | .......... | C23C 16/4584 118/500 |
| 6,416,037 B1 | 7/2002 | Geiser | | |
| 6,481,723 B1 | 11/2002 | Hao et al. | | |
| 6,629,682 B2 | 10/2003 | Duelli | | |
| 6,646,857 B2 | 11/2003 | Anderson et al. | | |
| 7,718,032 B2 * | 5/2010 | Kent | .................... | H01L 21/0337 156/345.37 |
| 7,750,818 B2 * | 7/2010 | Lee | .................... | H01L 21/67259 340/686.1 |
| 7,988,817 B2 * | 8/2011 | Son | .................... | H01L 21/68742 118/728 |
| 8,003,920 B2 * | 8/2011 | Hayashi | ............ | H01L 21/68742 118/728 |
| 8,363,378 B2 * | 1/2013 | Bluck | ............... | H01L 21/68742 361/234 |
| 8,383,000 B2 * | 2/2013 | Tsujimoto | .............. | G01B 21/16 216/59 |
| 8,425,521 B2 * | 4/2013 | Cremer | ................. | B23B 31/201 606/86 R |
| 8,864,144 B2 * | 10/2014 | Hsu | ...................... | B25B 23/0035 279/128 |
| 9,321,087 B2 * | 4/2016 | Goluch | ..................... | B08B 5/02 |
| 2005/0067603 A1 | 5/2005 | Lucas et al. | | |
| 2005/0092438 A1 | 5/2005 | Hur et al. | | |
| 2009/0314211 A1 * | 12/2009 | Du Bois | .......... | H01L 21/68742 118/729 |
| 2010/0116349 A1 | 5/2010 | Fischer | | |
| 2015/0348823 A1 * | 12/2015 | Chia | .................. | H01L 21/68742 269/296 |
| 2015/0377381 A1 * | 12/2015 | King | ........................ | F16K 3/02 251/274 |
| 2016/0370712 A1 * | 12/2016 | Shibazaki | ......... | H01L 21/68742 |
| 2017/0125280 A1 * | 5/2017 | Ghosh | ................ | C23C 16/4581 |
| 2017/0133260 A1 * | 5/2017 | Pohl | ................. | H01L 21/68742 |

FOREIGN PATENT DOCUMENTS

| | | |
|---|---|---|
| DE | 34 47 008 C2 | 6/1986 |
| EP | 2 171 334 A2 | 4/2010 |
| FR | 2 283 375 A1 | 3/1976 |
| FR | 2 516 615 A1 | 5/1983 |
| GB | 2 157 786 A | 10/1985 |

* cited by examiner

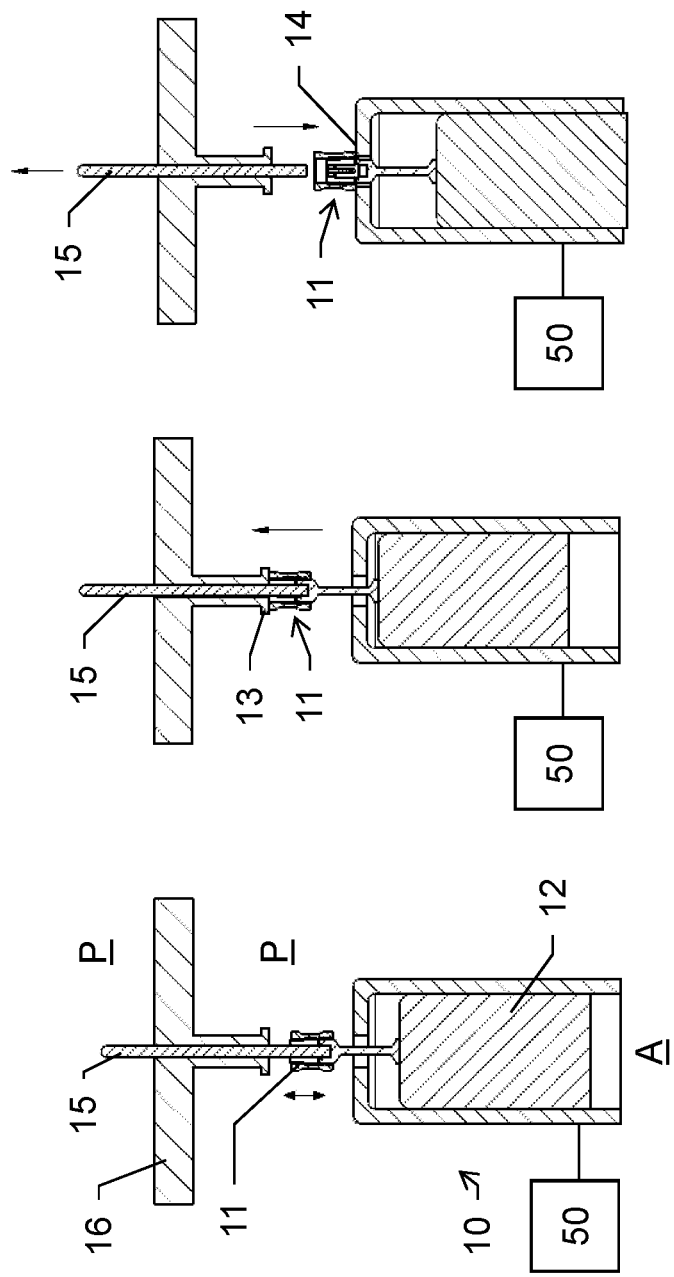

VACUUM ADJUSTMENT DEVICE HAVING A COLLET COUPLING

This application claims priority of Application No. EP 17188778.9 filed in Europe on Aug. 31, 2017, and which is herein incorporated by reference in its entirety.

The invention relates to a vacuum adjustment device for moving and positioning an active element which can be coupled to a drive unit in a process atmosphere.

Such adjustment devices designed for the vacuum range are used, for example, for positioning a substrate to be processed in a vacuum chamber. The substrate is typically introduced into the process volume by means of a robot, where it must be placed in the chamber for storage at specific storage points and in turn lifted off these points after processing. This positioning and movement in the process chamber is realized by means of specific adjusting devices, so-called pin lifting systems, also called pin lifters.

Pin lifting systems are used in particular in vacuum chamber systems in the field of IC, semiconductor, flat-panel or substrate production, which must take place in a protected atmosphere as far as possible without the presence of contaminating particles.

Such vacuum chamber systems comprise, in particular, at least one evacuable vacuum chamber provided for receiving semiconductor elements or substrates to be processed or produced and having at least one vacuum chamber opening through which the semiconductor elements or other substrates can be guided into and out of the vacuum chamber. For example, in a manufacturing plant for semiconductor wafers or liquid crystal substrates, the highly sensitive semiconductor or liquid crystal elements sequentially go through a plurality of process vacuum chambers in which the parts located within the process vacuum chambers are processed by means of a respective processing device.

Such process chambers often have other adjustment devices such as a transfer valve, the cross-section of which is adapted to the substrate and robot and through which the substrate can be introduced into the vacuum chamber and optionally removed after the intended processing. Alternatively, for example, a further adjustment device (transfer valve) may be provided, through which the processed substrate is brought out of the chamber.

Guiding the substrate, e.g. a wafer, occurs for example with a suitably formed and controlled robot arm, which can be guided through the opening of the process chamber which can be provided with the transfer valve. The loading of the process chamber then takes place by means of gripping the substrate with the robot arm, bringing the substrate into the process chamber and defined positioning of the substrate in the chamber. The emptying of the process chamber takes place in a corresponding manner.

For the deposition of the substrate and for the precise positioning of the substrate in the chamber, a relatively high accuracy and mobility of the substrate must be ensured. For this purpose, pin lifting systems are used which provide a plurality of support points for the substrate and thus a load distribution (due to the dead weight of the substrate) over the entire substrate.

The substrate is deposited by means of the robot on the extended support pins of the lifting system and deposited by lowering the pins on a support, e.g. a potential plate. For this purpose, the robot arm, which typically carries the substrate, is moved out of the chamber. The pins can be further lowered after depositing the substrate and are then separated therefrom, i.e. there is no contact between the pins and the substrate. After removal of the robot arm and closing (and introduction of process gas or evacuation) of the chamber, the processing step is performed.

A low action of force on the substrate is also particularly important after performing the process step in the chamber and a subsequent lifting of the substrate. The substrate typically has a relatively smooth surface which contacts and rests on the support when deposited. In this way, when attempting to detach the substrate from the carrier by negative pressure acting between the substrate and the carrier, this can result in a kind of adherence, e.g. caused by air pockets. If the substrate is pushed away too quickly from the support, the substrate may break, since the adhesive forces cannot be overcome or dissolved, at least at certain contact points. In addition, even when the contact between the support pins and the substrate comes about, an abutment against the substrate that occurs during this process can lead to undesired stress (or fracture). A corresponding force on the substrate is thus a critical factor in the substrate handling within the chamber.

At the same time, in addition to the gentlest possible and careful treatment of the substrate to be processed, the shortest possible processing time should be ensured. This means that the substrate can be brought as quickly as possible into the defined states—loading and unloading position and processing position—in the chamber.

To avoid unwanted shocks in the processing of semiconductor wafers for example, U.S. Pat. No. 6,481,723 B1 proposes the use of a special stop device instead of hard movement stops in a pin lifter. Any hard plastic stops should be replaced here by a combination of a softer configured stop member and a hard stop, wherein the contact with the soft stop member is made first for the movement limitation, and the hard stop is brought into contact in a subsequently and correspondingly dampened manner.

U.S. Pat. No. 6,646,857 B2 proposes a regulation of the lifting movement by means of a detected occurring force. The support pins can be moved here in response to the force signal obtained, so that the lifting force on the support pins always acts in a dosed and controlled manner on the wafer.

Another aspect concerning working processes under vacuum conditions and applied potentials is the possible influence of electrical and/or magnetic sources of interference. In this context, in particular in the design of a pin lifting system, it is necessary to consider possible influences on the processing procedure. Therefore, US 2005/0092438 A1 proposes a lifting device for example whose support pins can be electrically separated from a control plate by means of a non-conductive material.

Naturally, parts of the components moved with a vacuum adjustment device are present in a process volume and are therefore likewise exposed to the influences of a processing procedure. As a result, these parts can experience increased wear and typically require regular or demand-based maintenance or must be replaced regularly or as needed.

In a vacuum adjustment device designed as a pin lifting device, in particular the support pins are exposed to these wear influences and must be replaced accordingly.

In the case of a vacuum adjustment device formed as a vacuum valve, the valve closure (valve plate) is particularly affected by the process-related wear. These closures are therefore subject to such special maintenance requirements.

In general, vacuum valves for regulating a volume or mass flow and/or for the substantially gas-tight closing of a flow path, which leads through an opening formed in a valve housing, are known in various embodiments from the prior art and are used—as mentioned above—especially in vacuum chamber systems in the field of IC, semiconductor or substrate manufacturing, which must take place in a protected atmosphere without the presence of contaminating particles, if possible. Both during the processing procedure within the process vacuum chambers, as well as during the transport from chamber to chamber, the highly sensitive semiconductor elements or substrates must always be in a protected atmosphere—especially in a vacuum environment.

For this purpose, on the one hand peripheral valves are used for opening and closing a gas feed or discharge and on the other transfer valves for opening and closing the transfer openings of the vacuum chambers for the insertion and removal of the parts.

Due to the described field of application and the associated dimensioning as vacuum transfer valves, the vacuum valves passed through by semiconductors are also referred to as rectangular valves because of their generally rectangular opening cross-section and, due to their usual functioning, also as slide valves, rectangular valves or transfer slide valves.

Peripheral valves are used in particular for controlling or regulating the gas flow between a vacuum chamber and a vacuum pump or a further vacuum chamber. Peripheral valves are located, for example, within a pipe system between a process vacuum chamber or a transfer chamber and a vacuum pump, the atmosphere or another process vacuum chamber. The opening cross-section of such valves, also called pump valves, is generally smaller than in a vacuum transfer valve. Since peripheral valves, depending on the field of application, not only allow for the complete opening and closing of an opening, but also for controlling or regulating a flow by continuously adjusting the opening cross-section between a full open position and a gas-tight closed position, they are also referred to as control valves. One possible peripheral valve for controlling or regulating the gas flow is the pendulum valve.

In a typical pendulum valve, as known for example from U.S. Pat. No. 6,089,537 (Olmsted), in a first step, a generally round valve plate is rotationally pivoted via an opening, which is generally also round, from an opening-releasing position into an intermediate position covering the opening. In the case of a slide valve, as described for example in U.S. Pat. No. 6,416,037 (Geiser) or U.S. Pat. No. 6,056,266 (Blecha), the valve plate, as well as the opening, is generally rectangular and, in this first step, is pushed linearly from an opening-releasing position into an intermediate position overlapping the opening. In this intermediate position, the valve plate of the pendulum or slide valve is in spaced opposition to the valve seat surrounding the opening. In a second step, the distance between the valve plate and the valve seat is reduced, so that the valve plate and the valve seat are pressed uniformly against each other and the opening is closed substantially gas-tight. This second movement is preferably carried out substantially in a direction perpendicular to the valve seat. For example, the seal can either be provided via a sealing ring arranged on the closure side of the valve plate which is pressed onto the valve seat surrounding the opening, or via a sealing ring on the valve seat, against which the closure side of the valve plate is pressed. Due to the closing process which occurs in two steps, the sealing ring between the valve plate and the valve seat is hardly subjected to shearing forces that would destroy the sealing ring, since the movement of the valve plate in the second step takes place substantially rectilinearly perpendicular to the valve seat.

Different sealing devices are known from the prior art, for example from U.S. Pat. No. 6,629,682 B2 (Duelli). A suitable material for sealing rings and seals in vacuum valves is, for example, fluororubber, also called FKM, in particular the fluoroelastomer known under the trade name "Viton", and also perfluororubber, FFKM for short.

From the prior art, different drive systems for achieving this combination of a rotary movement of the valve plate in the pendulum valve and a translational movement of the valve plate in the slide valve parallel through the opening and a substantially translational movement perpendicular to the opening are known, for example from U.S. Pat. No. 6,089,537 (Olmsted) for a pendulum valve and from U.S. Pat. No. 6,416,037 (Geiser) for a slide valve.

The pressing of the valve plate on the valve seat must occur in such a way that both the required gas tightness is ensured within the entire pressure range, as well as damage to the sealing medium, in particular the sealing ring in the form of an O-ring, is avoided by excessive pressure stress. To ensure this, known valves provide a pressure difference control of the valve plate which is regulated depending on the pressure difference prevailing between the two valve plate sides. However, a uniform force distribution along the entire circumference of the sealing ring is not always guaranteed, especially with large pressure fluctuations or the change from negative pressure to positive pressure, or vice versa. In general, the aim is to decouple the sealing ring from supporting forces resulting from the pressure applied to the valve. In U.S. Pat. No. 6,629,682 (Duelli), a vacuum valve with a sealing medium is proposed in this case for example, which is composed of a sealing ring and an adjacent support ring, so that the sealing ring is substantially freed of supporting forces.

In order to achieve the required gas-tightness, optionally for both overpressure and underpressure, additionally or alternatively to the second movement step, some known pendulum valves or slide valves provide a valve ring which is displaceable perpendicular to the valve plate and surrounds the opening, which is pressed onto the valve plate for the gas-tight sealing of the valve. Such valves with valve rings which are actively displaceable relative to the valve plate are known, for example, from DE 1 264 191 B1, DE 34 47 008 C2, U.S. Pat. No. 3,145,969 (von Zweck) and DE 77 31 993 U. U.S. Pat. No. 5,577,707 (Brida) discloses a pendulum valve with a valve housing having an opening and a valve plate which is pivotable in parallel across the opening for controlling a flow through the opening. A valve ring, which encloses the opening, is vertically movable in the direction of the valve plate by means of several springs and compressed air cylinder. A possible further development of this pendulum valve is proposed in US 2005/0067603 A1 (Lucas et al.).

The said vacuum valves have in common that in each case a movable valve closure is usually guided with a polymer-based sealing material by means of a drive and is provided to provide the valve effect. The closure is typically subjected at least partially to the processing procedure and thus to increased wear. A regular or need-based replacement of the valve closure is required accordingly.

When considering such vacuum adjustment devices in general, i.e. in particular pin lifting systems and vacuum valves, there is typically the need for replacement of a part of the device at regular or on-demand intervals. The maintenance or renewal of such active elements usually requires a stoppage or interruption of production processes and a more or less massive intervention in the overall system. For the exchange of a valve closure or a support pin this often requires the tedious loosening of fasteners for the corresponding element. This often leads to comparatively long downtimes and requires special tools for the maintenance process. Fastening means that provide a fixed arrangement of the active element in the process are also structurally often difficult to access.

The disadvantage of this circumstance also becomes apparent with suddenly occurring problems in the system (e.g. breakage of a support pin), which require a short-term and rapid intervention.

It is therefore the object of the present invention to provide an improved vacuum adjustment device in which the above disadvantages are reduced or avoided.

In particular, it is the object of the invention to provide an improved vacuum adjustment device, which enables an optimized, i.e. in particular faster and easier, maintenance of the device.

The invention is further based on the object to provide a vacuum adjustment device with correspondingly improved design for the optimized replacement of wearing parts.

These objects are achieved by the realization of the characterizing features of the independent claims. Features which further develop the invention in an alternative or advantageous manner can be found in the dependent claims.

The invention is based on the approach to provide a simpler possibility which avoids or reduces the risk of particle formation in a vacuum area for the maintenance of a vacuum adjustment system, i.e. any type of device having movable elements in the vacuum region. According to the invention, a specific coupling with a collet is to be used for this purpose.

A collet is typically a clamping means in order to clamp workpieces or tools with high accuracy and in a centric, fast and force-fit manner. Collets are often found on machine tools, but can also be secured in hand-operated cutters, small drills or graving tools with a collet in a handle.

A collet typically consists of an outer conical radially slotted sleeve with a round, sometimes square or hexagonal, bore of defined size. In particular, the collet has a collet receptacle with an inner cone matching the collet. It is tightened by tightening a locking element, e.g. a union nut, with which the collet is pressed into the inner cone of the collet receptacle and thus clamped.

As a result of the slotting of the collet, the bore can be compressed evenly in its interior, whereby the workpiece or tool is held in a force-fit manner. The clamping range of a collet is often comparatively small.

According to the invention, the actuation of the collet assembly (collet with locking element) is preferably carried out by means of a drive unit which moves the coupling. Optionally, the collet or the locking element can be moved to a stop for example and the locking element or the collet can accordingly be further moved relative to the thus motion-limited counterpart to close or open the coupling. As a result, no outside or external forces need to be applied in order to put the coupling in a different state.

In other words, the production of an open changing state or a closed working state of the coupling (or a change between these states) can preferably be provided solely by a targeted axial movement of the coupling, wherein within the scope of the total movement at least one of the elements of collet and locking element is co-moved only for a part of the entire movement distance and is stationary for the remaining movement distance relative to its counterpart or relative to the drive unit. In this movement phase, in which either at least collet or locking element remains axially non-adjusted, the change in state of the coupling occurs by the further movement of the other element.

The invention thus also relates to a vacuum adjustment device for an active element movable in a process atmosphere region (e.g. vacuum region), e.g. a vacuum valve with a valve closure or a pin lifting device with at least one support pin. The vacuum adjustment device has a coupling designed for coupling the active element and a drive unit which is designed and cooperates with the coupling such that the coupling is adjustable from a normal position in which the active element is present in an essentially non-effective state with respect to its intended effect, into an active position, in which the active element provides its intended effect in the coupled state, and back again. The device also has a separating device for separating the process atmosphere region from an outer atmosphere region, wherein the drive unit is at least partially associated with the outer atmosphere region and the coupling in particular with the process atmosphere region.

The coupling has a collet and locking element (clamping element) cooperating with the collet. The coupling defines a receiving axis for receiving the active element or a coupling device of the active element. The collet and the locking element are arranged axially along or parallel to the receiving axis in relation to such a relative position variation that the locking element is adjustable relative to the collet in an open position and in a closed position, in particular displaceable. The coupling provides an open changing state by interaction of the collet with the locking element in the open position and a closed working state in the closed position.

In particular, in the open changing state, an internal diameter defined by the collet is greater than the internal diameter defined by the collet in the closed working state.

The locking element may be formed, for example, as a coupling ring and can be guided along the cylindrical or conical collet or the collet can be actively guided accordingly by a fixing of the locking element. In both cases, a relative position variation occurs. A change of state from the open changing state to the closed working state or vice versa is preferably realized by an interaction of corresponding axial regions with different inner or outer radii of the two components.

In a specific embodiment, the vacuum adjustment device can be designed and configured such that a change between the open position and the closed position of the locking element can be carried out by means of an axial adjustment of the coupling by the drive unit and an existing axial movement limit for the collet or the locking element. In the axial movement of the coupling, either the collet or the locking element is fixed so that the respective other component can be moved relative thereto. As a result, the locking element can be brought into the open position or closed position.

For the opening or closing of the coupling, no intervention in the system or the device from the outside is necessary here. The active element can thus be removed and/or inserted easily, i.e. largely without the action of force.

According to one embodiment of the invention, at least one stop element may be provided, wherein the at least one stop element is arranged and configured for interaction with the locking element or the collet. The stop element can accordingly form a limitation of the movement distance provided on the drive side for the locking element or for the collet.

In particular, the stop element can be arranged on a housing of the vacuum adjustment device (e.g. housing of the drive unit), on a process chamber cooperating with the vacuum adjustment device or on the active element, or be formed by the housing, the process chamber or the active element.

The drive unit may be configured such that the locking element can be displaced into the open position and/or the closed position by means of interaction with the at least one stop element by means of a movement of the coupling effected by means of the drive unit.

In one embodiment of the invention, the drive unit can be designed for a linear axial movement of the coupling along or parallel to the receiving axis over a certain total range of movement and the at least one stop element can also be arranged for adjusting the locking element relative to the collet in the context of movement of the coupling in the total range of movement.

Due to its structural design, the drive unit can define two limits for a linear (axial) movement of the coupling. For example, the unit has a guide rod for this purpose, which is correspondingly linearly adjustable over a distance within these limits and on which the coupling is arranged. The stop element can be arranged in these limits so that it engages only in the path of movement of the locking element or the collet and thus interacts only with one of the components of the coupling.

The total range of movement for the coupling, in particular for the collet or the locking element, may thus be limited by a first and a second end position. In the first end position, the open changing state can be present or produced and the closed working state in the second end position.

The open changing state can be made available by adjusting the coupling or the collet to the first end position and the closed working state can be made available by adjusting the coupling or the collet to the second end position.

Furthermore, a first and a second action zone can be defined for the total movement area. The first end position limits the first action zone and the locking element is adjustable in the first action zone such that the collet is substantially free of radial force. The second end position limits the second action zone and the locking element is adjustable in the second action zone such that the collet is acted upon by a force acting radially inward, i.e. for example in the direction of a center axis of the collet. In the respective action zones, it is therefore possible to provide a respective functional state of the coupling by actively and selectively moving a component of the coupling relative to the other component (which is position-invariant in the course of this movement) by means of the drive unit.

In particular, the normal position and the active position of the coupling with respect to the total movement range are provided at least partially within the first and/or the second action zone.

For example, in a process operation of the device, the coupling is never displaced up to one of the end positions, but is moved over a travel distance that is within the total movement range and does not include the range limits. A movement into and in an action zone occurs only for the purpose of replacement or maintenance of the active element and thus the actuation of the coupling mechanism. The coupling is typically not driven up to a stop.

According to one embodiment, the collet may have, in particular a cylindrical or conical, inner collet receptacle, which defines the receiving axis. The dimensioning of the collet receptacle is particularly matched to the active element to be received. The collet may be formed as a radially slotted sleeve with varying outer diameter along the receiving axis, wherein an inner diameter of the locking element is smaller than a maximum outer diameter of the collet.

Collet and locking element can be further arranged such that the outer diameter of the collet cooperates with the inner diameter of the locking element and a receiving force on the collet which is radially directed towards the collet receptacle can be generated by means of axial displacement of the locking element along the receiving axis.

A clamping of the collet can provide a force-fit connection, i.e. a force-fit fixing of the active element, in cooperation with an employed active element.

Alternatively or additionally, in a closed state of the coupling, a positive connection can be provided between the coupling and the active element. For this purpose, the active element can have an annular circumferential groove for example, into which engages a corresponding part of the collet when closing, thus providing the retention of the active element.

The adjustment device is designed in particular for use in a vacuum region, wherein a part of the adjustment device is present in the vacuum region and is moved, and another part, preferably parts of the drive unit, is present outside this region. The separating device for atmospheric separation of the two regions may be provided for this purpose by the drive unit and can be formed, for example, by a housing or a bellows of the drive unit.

Alternatively, the separating device may also be provided such that the coupling is partially or completely outside the vacuum region and is moved. The separating device may be connected, for example, to the chamber wall of a process chamber.

The separating device may, for example, be formed as a bellows or as a sliding feedthrough, which is sealed for example with an O-ring.

The drive unit can also be designed as an electromechanical or pneumatic drive, in particular a pneumatic drive cylinder.

The active element can be realized as a support pin of a pin lifting device or as a valve closure of a vacuum valve.

In one embodiment of the invention, the vacuum adjustment device may include a control unit for controlling the drive unit, wherein the control unit has a maintenance functionality configured such that, when executed, the axial position of the coupling is variable to provide the changing state or the closed working state.

Thus, a user-side function, which can be executed as required, can be implemented, which automatically performs the displacement of the coupling for equipping or removing the active element by means of the drive unit.

According to one embodiment, the vacuum adjustment device is formed as a pin lifting device, in particular a pin lifter, for the movement and positioning of a substrate to be processed, in particular a wafer, in a process atmosphere region provided by a vacuum process chamber is formed and comprises the coupling as the first coupling, in particular out of a plurality of couplings.

The drive unit here provides the at least linear mobility of the first coupling. The active position is formed in this case by an equipping position for equipping the pin lifting device with the substrate and the coupling is designed to receive a support pin configured for contacting and carrying the substrate and forming the active element. The intended effect of the active element (support pin) can be considered here as the carrying, lifting and lowering of a substrate to be processed.

The normal position, which can be produced by the linear mobility of the first coupling, is in particular represented by a lowered position of the support pin, in which there is no contact with the substrate.

The collet coupling allows easy and quick replacement of a support pin. It is an advantage of this arrangement that for such an exchange, only the coupling must be moved to a predefined change position and no further mechanical intervention must be made on the device. The pin can then be easily removed and a new pin inserted into the opened coupling. Especially in hard-to-reach process chambers such a design of a pin lifting device is advantageous because the maintenance can be performed without special knowledge or tool.

The pin lifting device is in particular designed such that both the active and normal position and also the open changing state and the closed working state can be produced by means of a targeted linear movement or positioning of the coupling or a component of the coupling. For this purpose, preferably only the movement or positioning of the coupling is required, wherein an interaction with a stop which is stationary relative to the drive unit is provided for the provision of the open changing state and the closed working state. Said targeted linear movement or positioning can be provided by the drive unit.

In a further embodiment, the vacuum adjustment device can be designed as a vacuum valve, in particular a vacuum slide valve, pendulum valve or monovalent valve, for regulating a volume or mass flow and/or for the gas-tight interruption of a flow path. In this case, the vacuum adjustment device has a valve seat which has a valve opening defining an opening axis and a first sealing surface surrounding the valve opening, and also has a valve closure forming the active element, in particular a valve plate, for regulating the volume or mass flow and/or for interrupting the flow path (=intended effect), with a second sealing surface corresponding to the first sealing surface.

The valve closure is coupled by means of the coupling to the drive unit such that the valve closure is adjustable from an open position as a normal position, in which the valve closure and a valve seat of the vacuum valve are relative to each other without contact, into a closed position as an active position, in which via an interposed seal a sealing contact exists between the first sealing surface and the second sealing surface and the valve opening is thereby sealed gas-tight, and back again. The coupling is designed accordingly to receive the valve closure.

Again, it is an advantage of the arrangement that the valve closure can be easily brought into a detached removal position and can be removed and replaced with correspondingly little effort, i.e. in particular without an additional release of retaining screws.

Figure 2B:
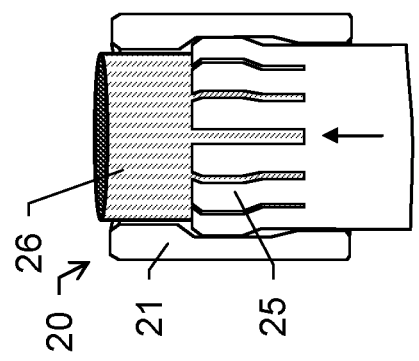
Figure 2A:
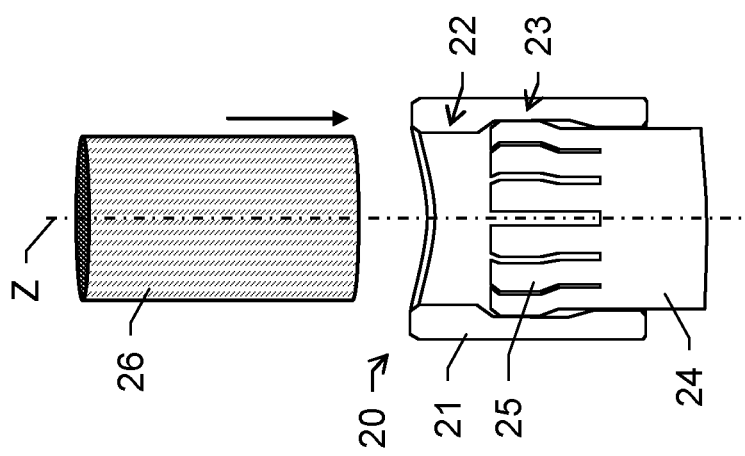
Figure 3A:
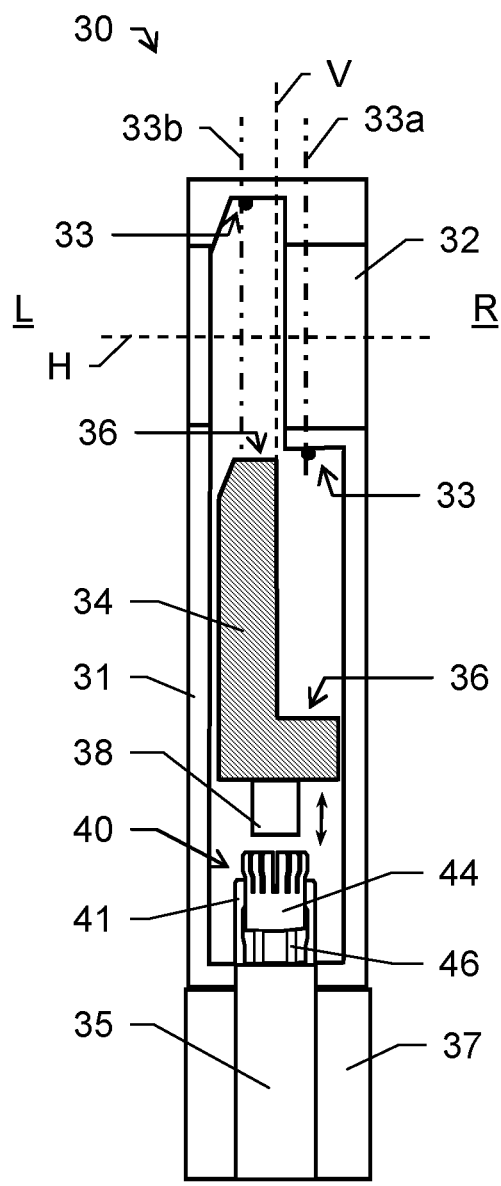
Figure 3B:
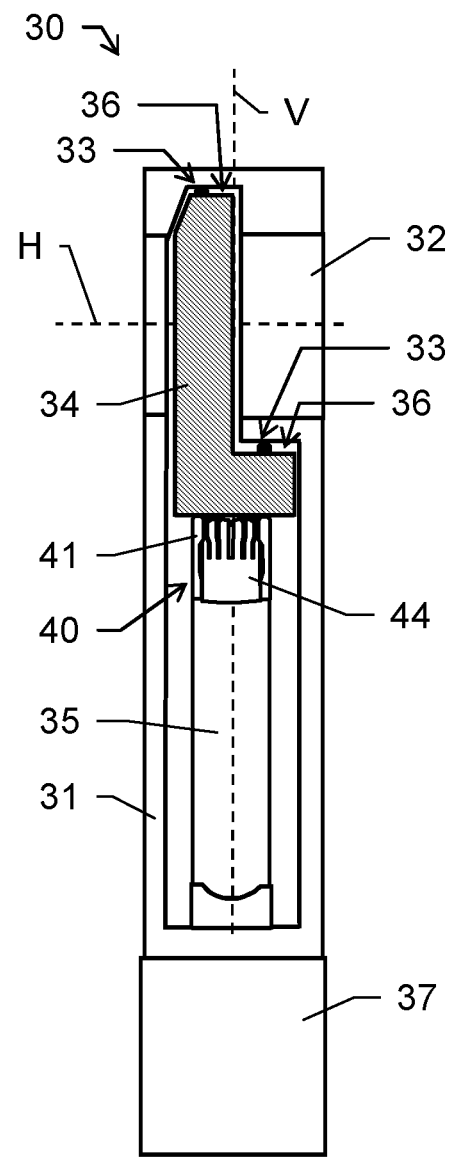

The devices according to the invention are described below purely by way of example with reference to concrete embodiments shown schematically in the drawings, which also address further advantages of the invention, wherein the drawings show in detail:

FIGS. 1a-c show an embodiment of a vacuum adjustment device according to the invention designed as a pin lifting device in different positions;

FIGS. 2a-c show an embodiment of a collet coupling of an adjustment device according to the invention in different states; and FIGS. 3a-b show a further embodiment of a vacuum adjustment device according to the invention designed as a vacuum valve.

FIGS. 1a to 1c show schematically an embodiment of a vacuum adjustment device 10 formed as pin lifting device in different positions.

FIG. 1a shows the pin lifting device 10 in an operating or production state with a supporting pin 15 connected to a drive unit 12 by means of a coupling 11. The supporting pin 15 projects through a chamber wall 16 of a process chamber into the chamber interior. The drive unit 15 provides a linear axial (here: vertical) movement of the support pin 15 within the limits of a defined range of movement. This range of movement is limited here in particular by the arrangement of drive unit 15 relative to the process chamber.

In particular, the drive unit is controlled in such a way that the support pin 15 is set into a receiving position for equipping the process chamber, i.e. it projects far into the process chamber. A substrate, e.g. a wafer, can be introduced by means of a robot arm through a vacuum transfer valve into a vacuum chamber. There, the robot arm allows a depositing of the wafer on the extended and further support pins (not shown here) of the pin lifting device 10. After placing the wafer on the pins, the robot arm is guided out of the chamber, the transfer valve is closed and the pins 15 are lowered by means of appropriate control. This is done by means of a drive or lifting cylinder of the drive unit 12 which is coupled to the pin 15 and thus provides a movement of the pin 15. The wafer can thus be deposited on intended support elements.

In this state, a planned processing (e.g. coating) of the wafer under vacuum conditions and in particular in a defined atmosphere (i.e. with a certain process gas) then typically takes place. The chamber is coupled for this purpose to a vacuum pump and preferably to a vacuum control valve for controlling the chamber pressure (not shown).

After processing, the wafer is raised again to a removal position by means of the pin lifting device 10. With a second robot arm, the wafer is subsequently removed through a second transfer valve. Alternatively, the process may be designed with only one robot arm, wherein placement and removal is then carried out by a single transfer valve.

The support pin 15 is made in particular from an electrically non-conductive, e.g. ceramic, material and is cylindrical. The support pin 15 may alternatively be conductive, e.g. made of metal.

The support pin is further clamped in the coupling 11 and can be used in this clamped state for carrying out the loading and unloading of the process chamber.

As described above, over the duration of multiple part production due to wear or tear on the support pin 15, at least one replacement of the pin 15 will typically be required. The solution shown here allows easy and speedy maintenance of the pin 11 and optionally the device 10. For this purpose, the coupling 11 is provided between the support pin 15 and drive 12 and designed specifically.

The coupling 11 has an inner collet and an outer locking element (e.g. a coupling ring), which cooperates with the collet. The locking element is adjustable relative to the collet axially along a receiving axis into an open position and a closed position, in particular displaceable in relation thereto. The receiving axis is formed by the displacement of the coupling 11 and the inner collet receptacle which is cylindrical or conical for example and is formed by the collet. In FIG. 1a, the coupling 11 is shown in a closed, clamped state, wherein the support pin 15 is locked by the tensioned collet in the coupling 11. The locking can be produced and released again by a corresponding axial adjustment of the locking element.

The coupling can accordingly be displaced by the interaction of the collet with the locking element in an open changing state (open position of the locking element) and in a closed working state (closed position of the locking element).

An actuation of the locking element and thus a change in the coupling state can be carried out by a targeted control of the drive unit.

A part of the vacuum adjustment device 10 is located in a process atmosphere region P (vacuum area). This region P is not limited solely to the internal volume of the process chamber, but also expands through the passage for the support pin 15 to an area below the chamber. Also, the coupling 11 is thus disposed in the process atmosphere P. As already stated above, increased demands are placed within the process atmosphere P on process integrity, process reliability and cleanliness. Prevention of particles is considered a priority criterion. By means of the collet coupling 11, this requirement can be met. Due to the comparatively low effort and the correspondingly reduced sources of particle generation for replacing a support pin—there are, for example, no screw connections to be released and actuation can be done by the drive unit—, a significant improvement in a typical adjustment assembly can be achieved with the use of a collet coupling 11.

The coupling 11 may alternatively (not shown) be present in the outside atmosphere region A, wherein an atmospheric separation, e.g. by means of the chamber wall (e.g. sealed pin feedthrough), is provided.

FIG. 1b shows the vacuum adjustment device 10, wherein the coupling 11 is moved by means of the drive unit 12 to a stop 13 (in the direction of the arrow). The stop 13 provides an actuation of the coupling 11, in particular of the locking element. The drawing shows the already established locking of the pin 15 after the relative movement of the locking element. The support pin 15 is thus in a blocked position in the coupling 11 and can be used in this state to perform a machining process.

FIG. 1c shows the coupling 11 in the opened state and a pin 15 which is released from the coupling 11 or is to be inserted into the coupling 11. To open the coupling 11, it is brought into contact with a lower stop 14. The axial mobility of the locking element of the coupling 11 is limited on one side by this stop 14. The locking element is moved in a first step in contact with the stop 14 and in a subsequent step, the inner collet is further offset in the same axial direction. In other words, the collet is at least partially pulled out of the locking element. As a result, a radially inwardly directed force is reduced or dissolved on the collet and thus the force required to lock the pin 15.

The reverse occurs for closing the coupling 11. The locking element is moved to the stop 13, in particular only for the purpose of making contact (in an essentially force-free manner), and the collet is then pushed by a continued axial movement into the element, whereby the collet is braced, i.e. the radially acting force is generated or increased on the collet. The support pin 15 is inserted before the insertion of the collet into the coupling 11.

FIGS. 2a to 2c show an embodiment of a collet coupling 20 of an adjustment device according to the invention in different states.

With FIG. 2a, the coupling 20 is shown in an open changing state without an assembly with an active element (e.g. valve plate or support pin). Reference numeral 26 designates a part of a cylindrical coupling section of an active element, i.e. the part of the element which is to be received in the coupling 20 and locked therein for its further use.

The locking element, here designed as a coupling ring 21, has different inner radii or inside diameters with respect to the axial extension thereof. In a first end region 22, the inner radius is smaller compared to a central region 23.

The collet 24 is adapted to the dimensions of the locking element 21 with respect to its spatial extension. The collet 24 has in an upper sleeve section a plurality of bracing or clamping legs 25, which are arranged here annularly. In particular, the collet 24 is formed as a slotted sleeve. The outer diameter of the collet in the region of the clamping legs 25 corresponds (without the presence of a force on the collet) substantially to the inner diameter of the coupling ring 21 in the central region 23 or is designed slightly larger to provide a defined pretension.

The clamping legs 25 each have ends angled towards a central axis, where they produce a smaller internal diameter. This reduced (force-free) inner diameter substantially corresponds here to the diameter of the collet 24 in the lower region, below the clamping elements 25.

The inner diameter of the coupling 20 in the open changing state, i.e. in particular the smallest inner diameter of the collet 24, and the (outer) diameter of the cylindrical coupling section 26 are applied with a corresponding spatial extension. The coupling section 26 can thus be introduced into the coupling 20 without considerable effort. It is understood that the collet 24 may have a slightly smaller inner diameter in order to provide a certain pretensioning and accurate alignability of the received coupling section 26.

According to the invention, such a coupling design can be part of a vacuum adjustment device. A control 50 of the drive unit, which provides at least axially mobility of the coupling 20, is preferably configured such that a movement of the collet 24 in a stop of the locking element 21 can take place such that the axial region of the clamping elements 25 is adjustable only within the limits of the end region 22 and the central region 23. This can ensure that the collet 24 is not pulled out of the coupling ring 21.

FIG. 2b also shows the coupling 20 in the open position. The coupling section 26 of the active element is inserted into the coupling 20 and pushed therein into the collet 24, but not locked. The coupling section 26 can thus be rotated, for example, about its axis of extension. The collet 24 has in particular at the lower end an inner boundary, e.g. an edge or stop, so that the coupling section 26 can be inserted into the collet 24 with a certain depth. This allows achieving a very precise reproducibility for the position of the active element.

FIG. 2c shows the coupling 20 in a closed working state. The locking element 21 is offset for this purpose relative to the collet 24 in a closed position. The end region 22 of the locking element 21 in this case corresponds axially with respect to its position at least partially with the clamping legs 25, in particular with the region of the clamping legs 25 having an enlarged outer radius. This interaction results in a clamping force on the clamping legs 25 directed in the direction of the inner collet receptacle.

The clamping force creates a bracing or clamping of the clamping legs 25 to the coupling section 26 such that the coupling section 26 is locked, i.e. it can withstand a comparatively large tensile force applied to the coupling section 26.

In order to reach the closed position (FIG. 2b after FIG. 2c), the locking element 21 is in particular moved to an upper position stop and the collet 24 together with the inserted coupling section 26 is then pressed into the locking element 21.

In order to reach the open position (FIG. 2c after FIG. 2a), the locking element 21 is moved in particular to a lower position stop and the collet 24 together with the inserted coupling section 26 is then pulled out of the locking element 21 over a defined distance.

FIGS. 3a and 3b show schematically another embodiment of a vacuum adjustment device according to the invention, which is designed as a vacuum valve 30. In the example, the valve 30 is designed as a so-called mono valve and shown in cross-section in a valve-open position (FIG. 1a) and a valve-closed position (FIG. 1b).

The valve 30 for gas-tight closing of a flow path by means of a linear movement has a valve housing 31 with an opening 32 for the flow path, wherein the opening 32 has a geometric opening axis H along the flow path. The opening 32 connects a first gas region L, which in the drawing is to the left of the valve 30 or a separating wall (not shown), with a second gas region R to the right thereof. Such a separating wall is formed, for example, by a chamber wall of a vacuum chamber.

The closure element 34 (valve plate) forms the active element and is linearly displaceable along a geometric adjustment axis V, which extends transversely to the opening axis H, in a closure element plane from an open position releasing the opening 32 into a closed position which is linearly pushed in a closing direction over the opening 32 (FIG. 3b) and vice versa back in an opening direction by means of a drive unit 37 with a movable adjusting element 35, in the example a valve rod.

For example, a (curved) first sealing surface 33 encloses the opening 32 of the valve housing 31 along a first section in a first plane 33a and along a second section in a second plane 33b. The first plane and the second plane are spaced apart, extend parallel to each other and parallel to the closure element plane. Thus, the first section 33a and the opposite second section 33b thus have a geometric offset to each other transversely to the adjustment axis V and in the direction of the opening axis H. The opening 32 is arranged between the two opposite sections 33a and 33b in the region extending along the adjustment axis V.

The closure element 34 has a second sealing surface 36 corresponding to the first sealing surface 33, which extends along sections corresponding to the first and second sections 33a, 33b.

In the example shown, a sealing material forming a seal is provided on the first sealing surface 33 of the valve seat. Alternatively or additionally, the seal may be arranged on the second sealing surface 36 of the valve closure.

The seal may, for example, be vulcanized onto the valve seat as a polymer by means of vulcanization. Alternatively, the seal can be designed, for example, as an O-ring in a groove of the valve seat.

Also, a sealing material may be adhered to the valve seat and thereby embody the seal. Such seals are of course not limited to the valve 30 described in the example, but are also applicable to the other described valve embodiments.

Mono valves, i.e. vacuum valves closable by a single linear movement, have the advantage for example of a relatively simple closing mechanism, e.g. compared to transfer valves which are closable by means of two movements, which require a drive with a relatively complex structure. Since the closure element can also be formed in one piece, it can be exposed to high acceleration forces, so that this valve can also be used for rapid and emergency closures. The closing and sealing can be done by means of a single linear movement, so that a very fast closing and opening of the valve 1 is possible.

In particular, it is an advantage of mono valves, for example, that the seal is not subject to any transverse load in the transverse direction to the longitudinal extension of the seal due to their progression during closing. On the other hand, due to its transverse extension relative to the opening axis H, the seal is hardly able to absorb forces acting on the closure element 34 along the opening axis H, which can act on the closure element 34, in particular with a large differential pressure, which requires a robust construction of the closure element 34, its drive and its storage.

The vacuum valve 30 shown in FIGS. 3a and 3b comprises according to the invention a coupling 40 with a collet 44 and a clamping element 41 (locking element) axially movable relative to the collet 44. The clamping element 41 is capable of displacing the coupling 40 into an open changing state and a closed working state by varying the axial relative position (relative to the collet). In FIG. 3a, the open changing state is shown.

The coupling 40 is designed in this case so that the clamping element 41 is coupled to the valve rod 35 and can be guided. The collet 44 is moved passively, i.e. the collet 44 is movable relative to the clamping element 41 in that the collet 44 abuts on a stop and the clamping element 41 is moved further, beyond the contact point. For this purpose, an inner stop 46 is provided, which is formed, for example, in the rod 35 designed as a tube. Alternatively, the stop 46 can also be actively moved axially, thus causing displacement of the collet 44.

The collet 44 is therefore supported by means of the stop 46 and the clamping element 41 is pulled over the collet 44. As a result, the coupling 40 is opened and the valve closure 34 and its coupling pin 38 can be removed.

For the insertion of a new valve closure 34, the pin 38 is inserted into the open collet 44 and the valve closure 34 is aligned in particular. To fix or lock the valve closure 34 in the coupling 40, the valve rod 35 is moved together with the inserted closure 34 along the vertical axis V upwards, i.e. into the valve-closed position. The displacement of the rod 35 occurs beyond a contact point (contact between the valve closure 34 and seal of the sealing surface 33), whereby the clamping element 41 is pushed over the movement-limited collet 44 and the coupling 40 is placed in a closed operating state.

With such a changing device, the valve plate 34 can be exchanged within the process gas region with little effort and simple means. The mechanical loosening of the valve plate 34 from the valve rod 35 and the coupling thereto can occur relevantly by a targeted adjustment of the vertical axis position of the coupling 40. Another mechanical intervention (e.g. loosening and tightening of screws) in the system can therefore be avoided. The risk of unwanted particle formation is reduced accordingly. Preferably, a specific drive sequence for the drive unit 37 is provided for this purpose.

It will be understood that the coupling embodiment shown or included in the present invention may be used in other types of vacuum valves of the prior art accordingly. Preferably, an arrangement for replacement and/or maintenance of a wear-prone valve closure may be appropriate. Conceivable is a corresponding arrangement of such a low-particle collet coupling which is releasable by a drive alternatively or additionally for other movable components in a vacuum processing process. Such embodiments are also encompassed by the present invention.

It is understood that the illustrated figures represent only possible embodiments schematically. The various approaches according to the invention can also be combined with one another as well as with vacuum devices, in particular for substrate processing or vacuum valves of the prior art.

The invention claimed is:

1. A vacuum adjustment device for an active element movable in a process atmosphere area (P), in particular vacuum region, comprising
a coupling designed for coupling the active element,
a drive unit designed in such a way and cooperating with the coupling such that the coupling is adjustable back and forth from
a normal position, in which the active element is present in the coupled state in a substantially effect-free state with respect to its intended effect,
into an active position, in which the active element provides its intended effect, and
a separating device for separating the process atmosphere region (P) from an outer atmosphere region (A), wherein the drive unit is assigned at least partially to the outer atmosphere region (A) and the coupling is assigned in particular to the process atmosphere region (P),
the coupling has a collet and a locking element cooperating with the collet, wherein
the coupling defines a receiving axis (Z) for receiving the active element,
the collet and the locking element are arranged axially or parallel to the receiving axis (Z) to such a relative positional variation that the locking element is adjustable, in particular displaceable, to an open position and to a closed position relative to the collet, and
the coupling provides an open changing state in the open position by the interaction of the collet with the locking element and a closed working state with the locking element in the closed position,
wherein the vacuum adjustment device is formed and configured such that a change between the open position and the closed position for the locking element is adjusted by an axial adjustment of the coupling by the drive unit using an existing axial movement limit for the collet or the locking element.

2. The vacuum adjustment device according to claim 1, wherein at least one stop element is provided, wherein the at least one stop element is arranged and formed for interacting with the locking element or the collet.

3. The vacuum adjustment device according to claim 2, wherein in that the stop element
is arranged on a housing of the vacuum adjustment device, on a process chamber cooperating with the vacuum adjustment device, or on the active element,
or is formed by the housing, the process chamber or the active element.

4. The vacuum adjustment device according to claim 2, wherein the drive unit is formed such that the locking element is displaceable into the open position and/or closed position by means of cooperation with the at least one stop element by a movement of the coupling produced by the drive unit.

5. The vacuum adjustment device according to claim 2, wherein
the drive unit is designed for a linear axial movement of the coupling along or parallel to the receiving axis (Z) for a specific total movement range, and
the at least one stop element is arranged in the total movement range for adjusting the locking element as part of a movement of the coupling.

6. The vacuum adjustment device according to claim 5, wherein the total movement range is limited by a first and a second end position for the coupling, in particular for the collet,
the open changing state is present in the first end position and
the closed working state is present in the second end position,
in particular wherein
the open changing state can be provided by an adjustment of the coupling and the collet into the first end position, and
the closed working state can be provided by an adjustment of the coupling and the collet into the second end position.

7. The vacuum adjustment device according to claim 5, wherein for the total movement range, a first and a second action zone are defined, wherein
the first end position limits the first action zone and the locking element is adjustable in the first action zone such that the collet is present substantially radially free of force, and
the second end position limits the second action zone and the locking element is adjustable in the second action zone such that the collet is acted on by a radial force.

8. The vacuum adjustment device according to claim 7, wherein the normal position and the active position of the coupling are provided with respect to the total movement range at least partially within the first and/or the second action zone.

9. The vacuum adjustment device according to claim 1, wherein
the collet has a cylindrical or conical inner collet receptacle which defines the receiving axis (Z),
the collet is designed as a radially slotted sleeve with a varying outer diameter along the receiving axis (Z),
an inner diameter of the locking element is smaller than a maximum outer diameter of the collet, and
the collet and the locking element are arranged such that
the outer diameter of the collet cooperates with the inner diameter of the locking element and
a force can be generated on the collet which is radially directed into the interior of the collet by means of adjusting the locking element along the receiving axis (Z).

10. The vacuum adjustment device according to claim 1, wherein
the separating device is formed by a housing or bellows of the drive unit,
and/or the drive unit is designed as a pneumatic drive cylinder.

11. The vacuum adjustment device according to claim 1, wherein the active element is formed as a support pin or as a valve closure.

12. The vacuum adjustment device according to claim 1, wherein the vacuum adjustment device comprises a control unit for controlling the drive unit, wherein the control unit has a maintenance functionality configured in such a way that in its execution, the axial position of the coupling is variable to provide the open changing state or the closed working state.

13. The vacuum adjustment device according to claim 1, wherein the vacuum adjustment device is formed as a pin lifting device, in particular a pin lifter, for the movement and positioning of a substrate to be processed, in particular a wafer, in a process atmosphere region (P) provided by a vacuum processing chamber and comprises the coupling as a first coupling, in particular out of a plurality of couplings, wherein
- the drive unit provides the at least linear mobility of the first coupling,
- the active position is formed by an equipping position for equipping the pin lifting device with the substrate, and
- the coupling is designed to receive a support pin designed to contact and support the substrate and form the active element.

14. The vacuum adjustment device according to claim 1, wherein the vacuum adjustment device is formed as a vacuum valve, in particular vacuum slide valve, pendulum valve or mono valve, for regulating a volume or mass flow and/or for the gas-tight interruption of a flow path, having
- a valve seat having a valve opening defining an opening axis (H) and a first sealing surface surrounding the valve opening, a valve closure forming the active element, in particular valve plate, for regulating the volume or mass flow and/or for interrupting the flow path, having a second sealing surface corresponding to the first sealing surface, the valve closure is coupled to the drive unit by means of the coupling such that the valve closure is adjustable from
- an open position as a normal position, in which the valve closure and the valve seat of the vacuum valve are present relative to each other without contact, into a closed position as the active position, in which a sealing contact between the first sealing surface and the second sealing surface is provided via an interposed seal and the valve opening is thus sealed in a gas-tight manner, and back again, and
- the coupling is designed to receive the valve closure.

* * * * *